United States Patent [19]

Novof

[11] Patent Number: 5,107,264
[45] Date of Patent: Apr. 21, 1992

[54] DIGITAL FREQUENCY MULTIPLICATION AND DATA SERIALIZATION CIRCUITS

[75] Inventor: Ilva I. Novof, Burlington, Vt.

[73] Assignee: International Business Machines Corporation, Armonk, N.Y.

[21] Appl. No.: 588,254

[22] Filed: Sep. 26, 1990

[51] Int. Cl.⁵ ............................................. H03M 9/00
[52] U.S. Cl. ...................................... 341/101; 341/61
[58] Field of Search ................... 341/61, 68, 101; 328/15, 16; 307/271

[56] References Cited

U.S. PATENT DOCUMENTS

| | | | |
|---|---|---|---|
| 4,377,806 | 3/1983 | Elliott et al. | 340/347 |
| 4,634,987 | 1/1987 | Nolte | 328/160 |
| 4,675,612 | 6/1987 | Adams et al. | 331/1 A |
| 4,713,621 | 12/1987 | Nakamura et al. | 328/55 |
| 4,777,448 | 10/1988 | Satoh | 328/138 |
| 4,901,076 | 2/1990 | Askin et al. | 341/100 |
| 4,954,826 | 9/1990 | Isozaki et al. | 341/100 |

OTHER PUBLICATIONS

Hernandez, Jr., "Frequency Multiplier Using Delay Circuits", IBM Technical Discl. Bulletin, p. 990, vol. 26, No. 3A, 1983.

Rein, Hans-Martin, "Multi-Gigabit-Per-Second Silicon Bipolar IC's for Future Optical-Fiber Transmission Systems", IEEE Jor. of Solid State Circuits, vol. 23, No. 3, pp. 664-675, 1988.

Lindsey, et al., "A Survey of Digital Phase-Locked Loops, Proceedings of the IEEE", vol. 69, No. 4, pp. 410-431, 1981.

Primary Examiner—Pellinen A. D.
Assistant Examiner—Marc S. Hoff
Attorney, Agent, or Firm—Heslin & Rothenberg

[57] ABSTRACT

A digital clock frequency multiplication and data serialization circuit for converting Q parallel data bits into a serial data stream is provided. A clock phase generator is coupled to receive the clock signal of the Q parallel data bits and output in response thereto Q synchronous clocks each of different phase. Logic circuitry is coupled to simultaneously receive the Q synchronous clocks and the Q parallel data bits. The Q synchronous clocks are used by the logic to gate a respective one of the Q parallel data bits such that the Q parallel data bits are sequentially output therefrom as a serial data stream. Circuits are provided for simultaneous frequency multiplication and return-to-zero data serialization and simultaneous frequency multiplication and nonreturn-to-zero data serialization. Further, digital clock frequency multiplication and synchronization circuits for converting a low frequency signal to a high frequency signal are described.

21 Claims, 7 Drawing Sheets fig. 1
(PRIOR ART)

fig. 2 fig. 3 fig. 4 fig. 5 fig. 6 fig. 7 fig. 8

DIGITAL FREQUENCY MULTIPLICATION AND DATA SERIALIZATION CIRCUITS

BACKGROUND OF THE INVENTION

1. Technical Field

This invention relates in general to communication systems and information and data processing systems, and more particularly, to digital clock frequency multiplication and data serialization techniques for converting a stream of Q parallel data bits into serial data for transmission and/or processing.

2. Description of the Prior Art

In optical fiber transmission systems the trend is to increase the data rate further to exploit the high transmission capacity of single-mode optical fibers. The limiting factor for data rate increases is usually not the optical fiber data carrying capability, but rather electronic circuit performance. In digital communication networks, such as fiber optic transmission systems, parallel data bits must be converted into a serial data stream at the transmitting end for transfer to a remote receiving end. Conversion of parallel data to serial data conventionally requires frequency multiplication of the parallel data clock. This is typically accomplished by a phase locked loop (PLL), which is an analog component well known in the art. Data serialization is normally accomplished via a special circuit called a serializer. The PLL and serializer are considered to be critical components of the data communication network. These circuits traditionally operate at the serial data stream rate and usually limit communication channel data carrying capability.

Figure 1:
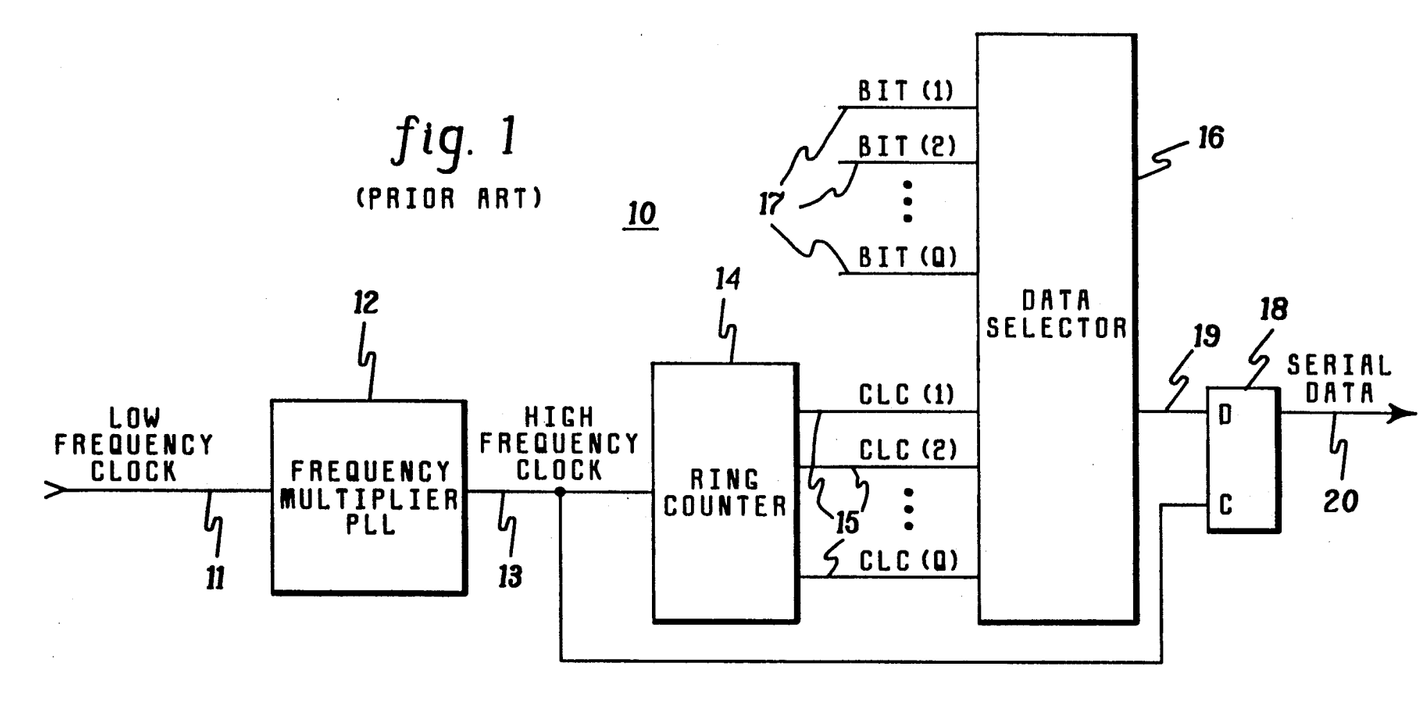
FIG. 1 is a block diagram representation of a prior art frequency multiplication and data serialization circuit.

A conventional frequency multiplication and data serialization circuit, generally denoted 10, is depicted in FIG. 1. Circuit 10 receives the parallel data clock (low frequency clock) on line 11 which is coupled to a PLL circuit 12. PLL 12 multiplies the parallel clock frequency and outputs on line 13 a serial data clock (high frequency clock) that is phase synchronized with the parallel data clock. The high frequency clock output of PLL 12 is input to a ring counter 14 and the clock "C" input of a data latch 18. Ring counter 14 produces Q synchronized pulses CLC(1), CLC(2), . . . , CLC(Q), wherein Q equals the number of parallel data bits. These synchronized pulses are output from counter 14 on respective lines 15 to a data selector 16, which uses the pulses as clocks for the parallel data bits which are input to data selector 16 on lines 17. A clock pulse on a line 15 causes a corresponding data bit on a line 17 to be transferred from a parallel data latch in selector 16 to the serial output stream on line 19. Line 19 is coupled to the data "D" input of latch 18, which again is clocked by the serial data clock from the PLL 12.

A phase locked loop typically includes a voltage controlled oscillator, phase detector, charge pump and filter. The voltage controlled oscillator's frequency is normally susceptible to noise, which manifests itself as jitter at the PLL output. Serial data jitter obviously degrades optical link performance and is therefore undesirable. With conventional technology difficulties are experienced in maintaining PLL jitter low in a noisy system environment. In addition, the ring counter and data select circuit of the prior art serializer of FIG. 1 consist of a large number of latches which must operate at a high frequency. These components therefore further limit the maximum serial data rate for a particular technology. Also, because of the large number of circuits required, power consumption makes large scale integration difficult.

The present invention, therefore, is designed to address the performance limitations of conventional frequency multiplication and data serialization technology, and thus allow for higher data rate signal processing for a given technology.

SUMMARY OF THE INVENTION

Briefly described, a simultaneous clock frequency multiplication and data serialization circuit for converting Q parallel data bits into a serial data stream is provided pursuant to a first aspect of the present invention. The circuit includes clock phase generating means for producing Q synchronous clocks of different phase in response to the parallel data clock signal. Coupled to receive the Q clocks and the Q parallel data bits is logic circuitry which uses each of the Q synchronous clocks to gate a respective one of the Q parallel data bits such that the Q parallel data bits are sequentially output from the logic circuitry as a serial data stream.

In one specific embodiment, the clock phase generating means comprises a delay line having Q taps, each tap outputting one of the Q synchronous clocks of different phase. Further, the logic circuitry includes: detecting means for detecting each of the Q synchronous clocks and outputting a signal pulse in response thereto; a plurality of AND gates, each AND gate being configured to receive at a first input one of the detector signal pulses and at a second input a respective one of the Q parallel data bits; and an OR circuit coupled to receive in parallel the output signals of the plurality of AND gates and combine the AND gate output signals into the serial data stream. Specific circuits for return-to-zero serialization and nonreturn-to-zero serialization are described and claimed.

In another aspect, the present invention comprises a digital frequency multiplication and synchronization circuit for generating a high frequency signal from a low frequency signal. The circuit includes clock phase generating means coupled to receive the low frequency signal and output in response thereto Q synchronous clocks each of different phase. Q detectors are each coupled to receive one of the Q synchronous clocks and output a signal pulse in response thereto. The signal pulses are transmitted in parallel to a logic circuiting which combines the pulses into the desired synchronous high frequency signal.

In a principal aspect, the present invention provides a novel technique for the simultaneous clock frequency multiplication and data serialization of parallel data. The digital techniques described herein accomplish clock frequency multiplication with less jitter than conventional approaches using PLL circuitry. In addition, the present data serialization circuits do not require latches, and are therefore simpler to implement than existing approaches, and can serialize data at a higher rate with less power consumption than conventional techniques, i.e., assuming the same technology and circuit speed.

BRIEF DESCRIPTION OF THE DRAWINGS

These and other objects, advantages and features of the present invention will be more readily understood from the follow detailed description of certain preferred embodiments of the present invention, when considered in conjunction with the accompanying drawings in which.

DETAILED DESCRIPTION OF THE INVENTION

Figure 2:
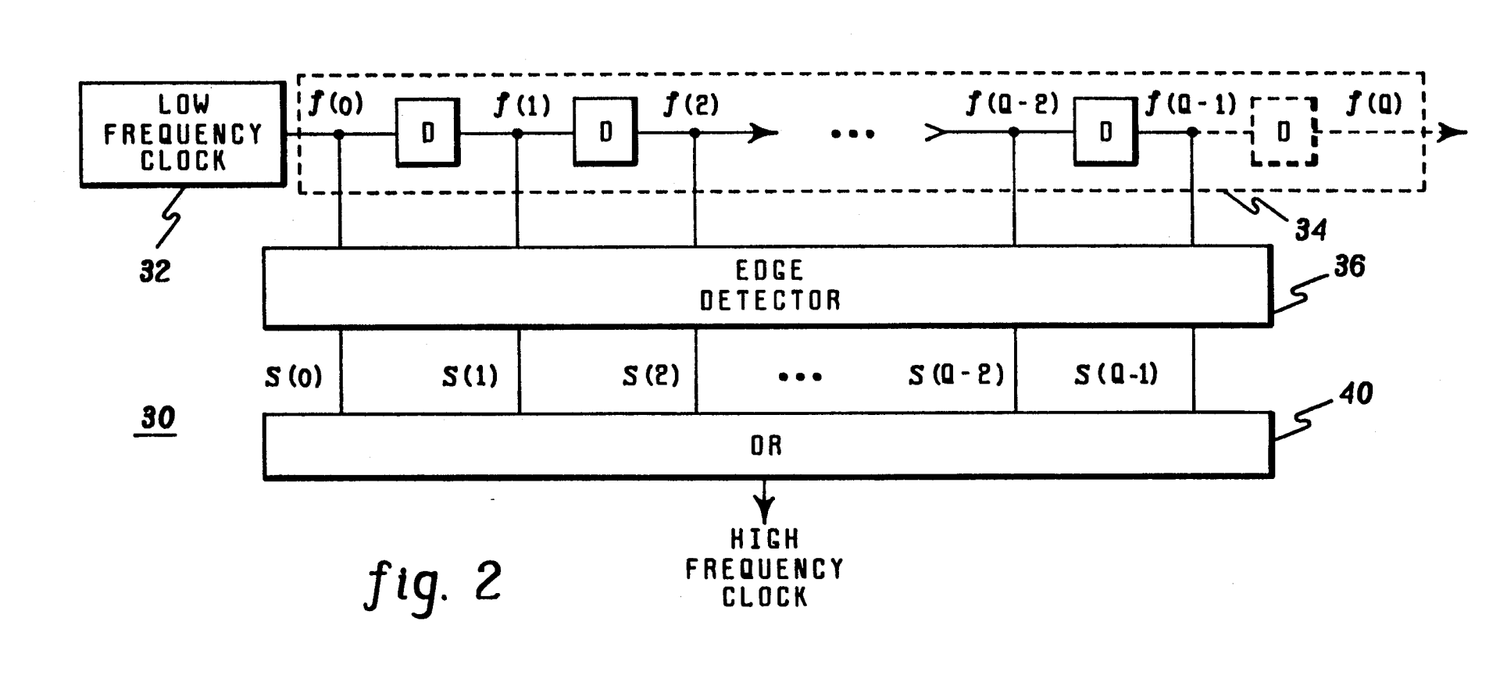
FIG. 2 is a block diagram representation of a frequency multiplication and synchronization circuit pursuant to the present invention.

Referring to FIG. 2, one aspect of the present invention is the provision of a digital clock frequency multiplication and synchronization circuit, generally denoted 30, for converting a low frequency clock, such as a parallel data clock, to a high frequency clock, such as that required for serial data transmission. (As summarized above, pursuant to the present invention data serialization is also preferably performed simultaneous with clock frequency multiplication. For Q parallel data bits to be serialized, the parallel clock frequency must be multiplied Q times to produce an appropriate high frequency data clock.)

In the embodiment shown, the low frequency parallel data clock 32 is fed to a delay line 34 which generates, through a plurality of circuit delays "D", a family of delay clocks f(0), f(1), f(2) . . . , f(Q-2), f(Q-1) of different phase. The delay clocks, which are each output at one of Q respective taps in line 34, are of the same frequency as low frequency clock 32 but different phase, except for f(0). The total delay T through delay line 34, including a Qth delay D shown in phantom within line 34, equals the low frequency clock period, and the delay D between adjacent delay line taps is defined as:

$$D = T/Q$$

wherein: Q = low frequency multiplication factor. Calibration techniques are known in the art for ensuring that the total delay of line 34 equals the low frequency clock period. When calibrated, f(Q) is in phase with f(0) and one clock period removed therefrom.

Figure 3:
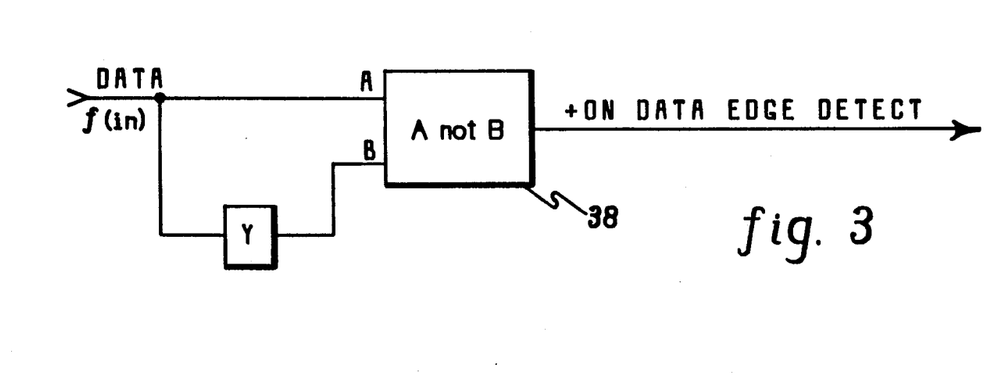
FIG. 3 is a block diagram representation of one embodiment of an edge detector useful in implementing the circuit of FIG. 2.

Coupled to each delay line tap is an edge detector 36 configured to detect one of the respective rising and falling delay clock edges. One embodiment of a rising edge detector is depicted in FIG. 3. A delay clock f(m), where m = 0, 1, 2 . . . , Q-2, Q-1, is fed simultaneously to one input, herein referred to as the A input, of an "A not B" circuit 38 and simultaneously to the input of a delay Y.

The output of delay Y is fed to the other input, herein referred to as the B input, of the "A not B" circuit. "A not B" logic has the following truth table:

| A | B | A not B |
|---|---|---------|
| 0 | 0 | 0 |
| 0 | 1 | 0 |
| 1 | 0 | 1 |
| 1 | 1 | 0 |

Essentially, "A not B" circuit 38, hereinafter A not B, inverts the B input and then gates the resultant signal in an AND gate with the A input. In FIG. 3, the output is a pulse which occurs on the positive clock transition edge. A negative clock transition edge detector is obtained by transposing the connections to the A and B inputs of circuit 38, with the understanding that the B input is to be inverted prior to gating with the A input. The particular circuit requirements will dictate whether edge detector 36 is to be implemented as a rising or falling edge detector. Obviously, with the detector embodiment of FIG. 3 Q edge detectors are needed, one for each delay clock f(m) (where m = 0, 1, 2, . . . , Q-2, Q-1) in order to frequency multiply the parallel data clock Q times.

Returning to FIG. 2, edge detector 36 outputs a pulse S(0), S(1), S(2) . . . , S(Q-2), S(Q-1) corresponding to each delay clock sampled. In the embodiment of FIG. 3, the length of each pulse is defined by delay time Y. Detector output pulses S(0), S(1), S(2) . . . , S(Q-2), S(Q-1) are input in parallel to an OR circuit 40 which outputs a pulse should any output of edge detector 36 contain a pulse. The desired high frequency clock is available at the output of OR circuit 40.

Figure 4:
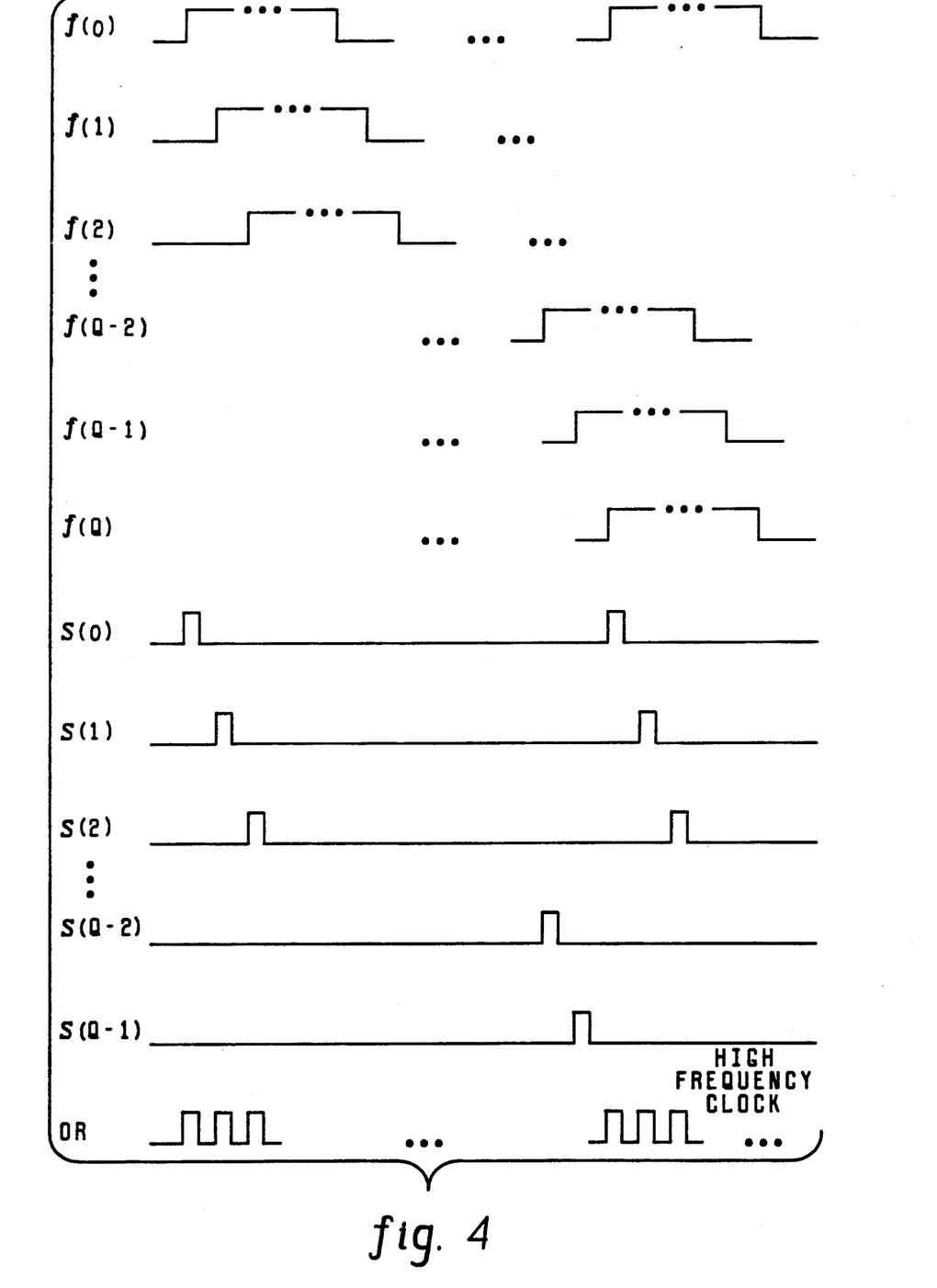
FIG. 4 is a timing diagram for the frequency multiplication and synchronization circuit of FIG. 2.

A frequency multiplication timing diagram is depicted in FIG. 4. Delay clocks f(0), f(1), f(2) . . . , f(Q-2), and f(Q-1) (f(Q) being equivalent to f(0) after the first cycle) are obtained from delay line 34 by detector 36. Detector 36 outputs pulses S(0), S(1), S(2) . . . , S(Q-2) and S(Q-1) in response to the corresponding detected delay clock. The output pulses from detector 36 are input in parallel to OR circuit 40 which outputs the desired high frequency clock. Again the high frequency clock output of OR circuit 40 is phase synchronized with the low frequency clock 32 and is Q times the low frequency. Also, as can be observed from the resultant high frequency clock signal depicted in FIG. 4, circuit 30 embodies a return-to-zero type (see below) digital clock frequency multiplication technique. (A nonreturn-to-zero digital clock frequency multiplication approach is described below.)

In another important aspect of the present invention, the digital frequency multiplication and synchronization technique of FIG. 2 is modified to provide data serialization simultaneous with frequency multiplication. Two well known formats for data serialization comprise return-to-zero and nonreturn-to-zero data encoding. Briefly described, return-to-zero (RZ) format requires that the coded signal return to a central or zero level between bit cells subsequent a data transition. The more commonly used format is the nonreturn-to-zero (NRZ) data code wherein no return is made to a central or zero level subsequent a data transition. With this encoding technique, the signal remains at a level one for the entire cell containing a one bit and goes to a zero state when there is a zero bit in the cell. Thus, transitions occur only where successive bit cells are in different states. Variations on the nonreturn-to-zero format are described in the open literature, along with other encoding techniques. The present invention described and claimed herein is intended to encompass simultaneous frequency multiplication and data serialization irrespective of the desired serial data format. By way of example, two circuit implementations, one for RZ encoding and the other for NRZ encoding will be described below. Those skilled in the art will recognize from the information provided herein the circuit modifications necessary to implement the concepts of the present invention in association with other encoding techniques.

Figure 5:
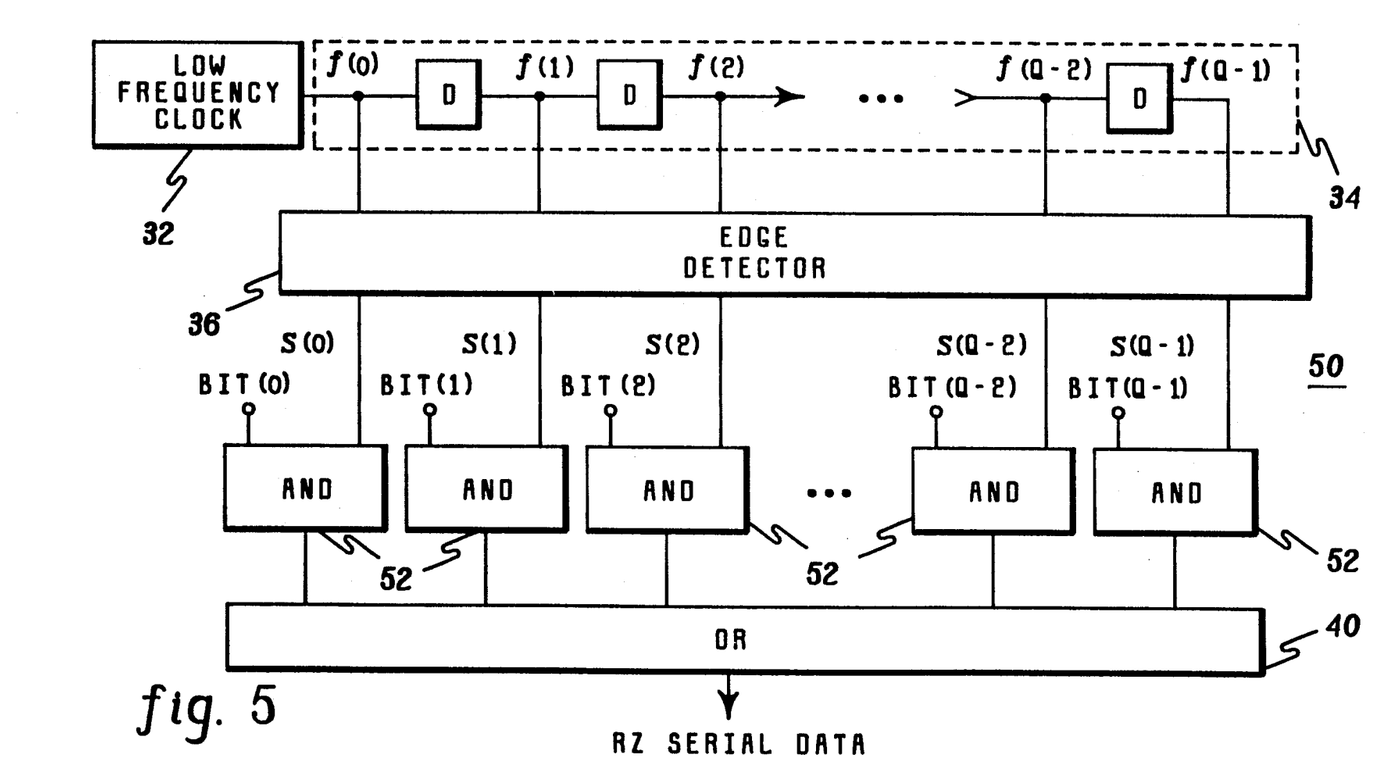
FIG. 5 is a block diagram representation of one embodiment of a combination frequency multiplication and return-to-zero data serialization circuit pursuant to the present invention.

FIG. 5 depicts one preferred embodiment of a simultaneous frequency multiplication and RZ data serialization circuit, generally denoted 50. Circuit 50 incorporates several components of frequency multiplication circuit 30 (FIG. 2). In particular, the low frequency clock input 32, delay line 34, edge detector 36 and OR circuit 40 are identical to the corresponding components described above in connection with the basic frequency multiplication circuit. As an extension, however, edge detector output pulses S(0), S(1), S(2) ..., S(Q-2), S(Q-1) are gated into input AND circuits 52 by respective parallel data bits, Bit(0), Bit(1), Bit(2) ..., Bit(Q-2), Bit(Q-1). The outputs of AND gates 52 are fed in parallel to OR circuit 40. OR circuit 40 outputs the converted parallel data bits as a serial return-to-zero data stream. In combination, AND circuits 52 and OR circuit 40 function as a multiplexer with the parallel data bits serving as the control inputs of the multiplexer.

Figure 6:
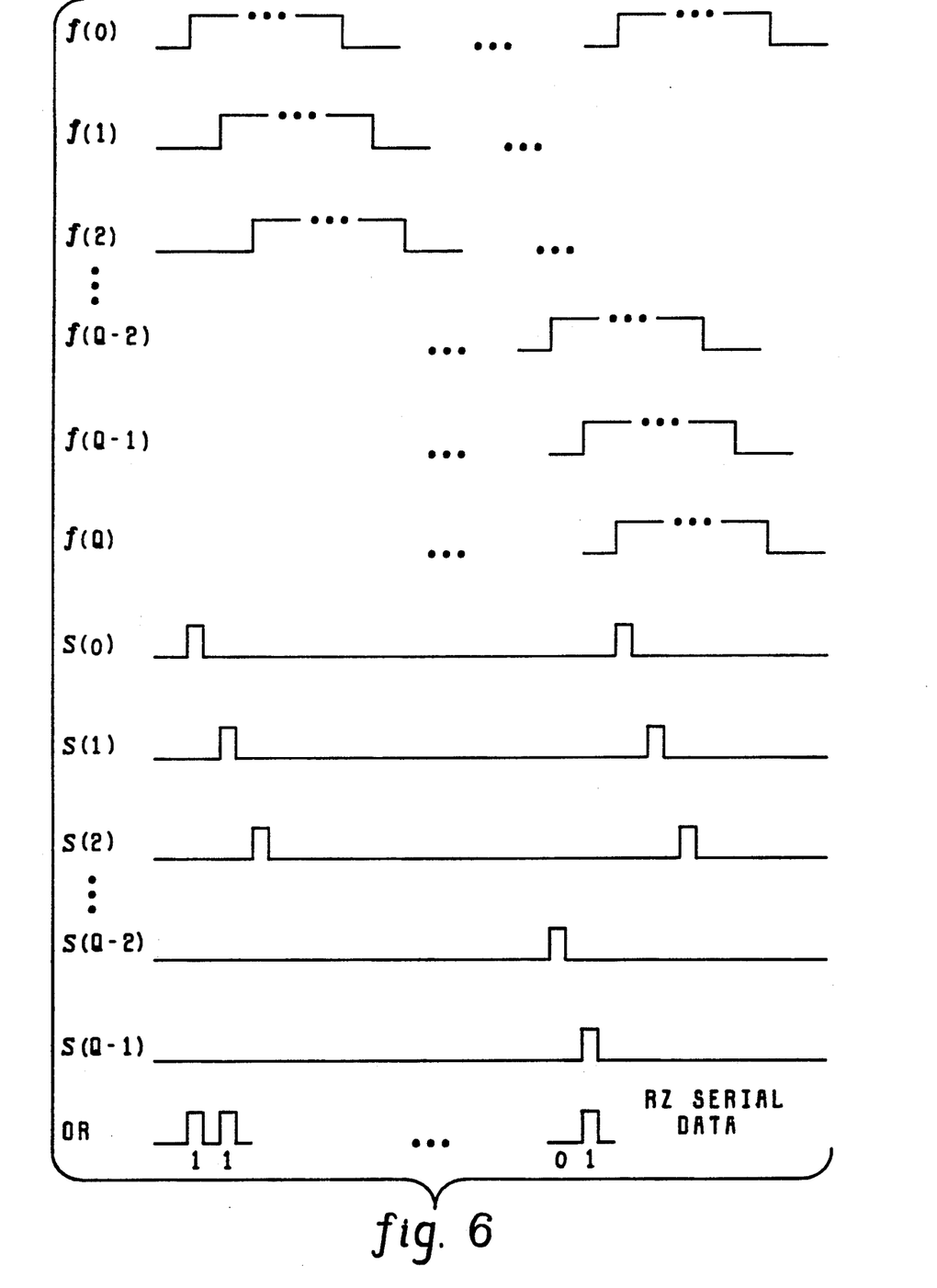
FIG. 6 is a timing diagram for the return-to-zero data serialization circuit of FIG. 5.

FIG. 6 depicts a sample timing diagram for the simultaneous frequency multiplication and return-to-zero data serialization of an arbitrary signal (Bit(0)=1, Bit(1)=1, ..., Bit(Q-2)=0, Bit(Q-1)=1). (With reference to this figure, recognize that a pulse from AND circuit 52 will be output only if a data bit (1) within the parallel data bits, Bit(0), Bit(1), Bit (2), ... Bit(Q-2), Bit(Q-1), is gated with a respective detector pulse S(0), S(1), S(2) ..., S(Q2), S(Q-1). A data bit (0) will obviously not be gated through an AND circuit as a pulse, but rather as a level zero.

Figure 7:
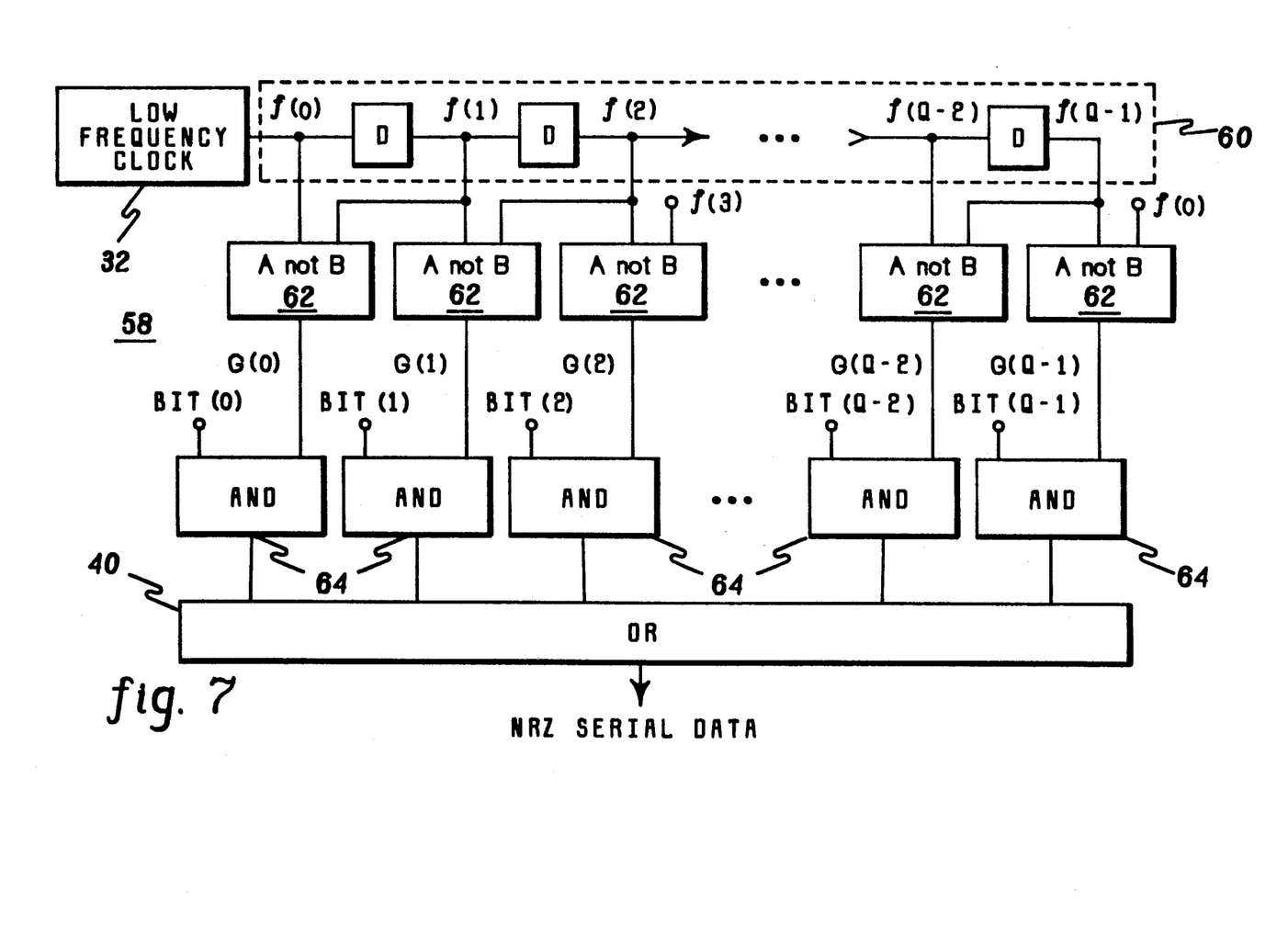
FIG. 7 is a block diagram representation of one embodiment of a combination frequency multiplication and nonreturn-to-zero data serialization circuit pursuant to the present invention.

FIG. 7 depicts a further modification of the frequency multiplication circuit of FIG. 2. This circuit, denoted 58, provides simultaneous frequency multiplication and nonreturn-to-zero data serialization. The low frequency clock 32 is initially fed to a delay line 60 which outputs a plurality of delay clocks of different phase f(0), f(1), f(2) ..., f(Q-2), f(Q-1). As shown, the edge detector of the prior circuit embodiments is replaced here with Q A not B circuits 62. Delays D in delay line 60 also function as delays between inputs to A not B circuits 62. Circuits 62 and their corresponding delays D between inputs can be considered edge detectors (cf. with FIG. 3). When data is serialized on the rising clock edge, the f(m-1) delay clock is applied to the A input (see prior discussion in connection with FIG. 3) and the f(m) delay clock is applied to the B input of each A not B circuit 62, wherein m=1, 2, ... , Q. If data is to be serialized on the falling clock edge, then the f(m-1) delay clock is applied to the B input and the f(m) clock is applied to the A input of A not B circuit 62. By using delays D of delay line 60 as the delay between inputs A and B, the output pulses from A not B circuits 62 are equal in length to the phase difference between the delay clocks. A not B circuit output pulses G(0), G(1), G(2), ..., G(Q-2), G(Q-1) are gated in respective two input AND circuits 64 by the parallel data bits, Bit(0), Bit(1), Bit(2) ... Bit(Q-2), Bit (Q-1). The resultant output signals from AND gates 64 (which remain level (1) or level (0) for the entire respective bit cell) are input in parallel to OR circuit 40 and output therefrom as a serial nonreturn-to-zero data stream.

Figure 8:
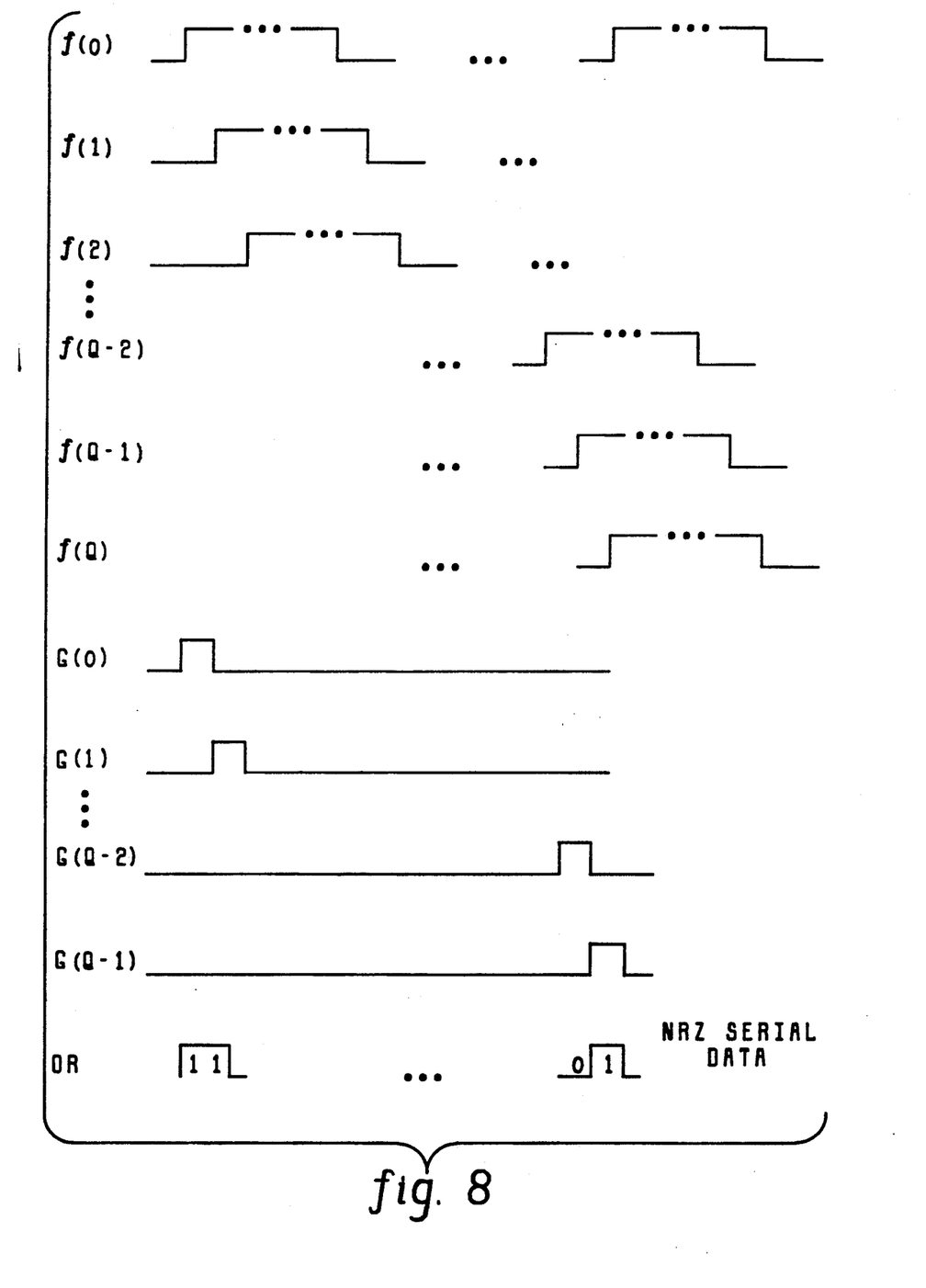
FIG. 8 is a timing diagram for the nonreturn-to-zero data serialization circuit of FIG. 7.

A timing diagram for nonreturn-to-zero data serialization is shown in FIG. 8 (again, by way of example, Bit(0)=1, Bit (1)=1, ... Bit(Q-2)=0, Bit(Q-1)=1). If desired, nonreturn-to-zero data serialization and return-to-zero data serialization can be easily intermixed in the same data stream simply by selecting the appropriate circuit scheme (FIG. 5 or FIG. 7) for different parallel data bits. Also, those skilled in the art will recognize that circuit 50 (FIG. 5) or circuit 58 (FIG. 7) could be readily modified to accommodate other combinations of encoding techniques. In all circuit embodiments, however, means for generating synchronous clocks of multiple phase are combined with appropriate logic circuitry to simultaneously frequency multiply and data serialize the Q parallel data bits.

Lastly, those skilled in the art will recognize that the nonreturn-to-zero circuitry of FIG. 7 can also be modified for clock frequency multiplication. In particular, by eliminating AND circuits 64, connecting the outputs of A not B circuits 62 in parallel to the inputs of OR circuit 40, and inputting a 101010 ... low frequency clock signal, a symmetrical, multiplied clock frequency output is obtained.

It will be observed from the above discussion that simultaneous digital clock frequency multiplication and data serialization is accomplished by the present invention. Further, the digital techniques described herein allow clock frequency multiplication with less jitter than conventional approaches since the circuits are less susceptible to noise. In addition, the data serialization circuits presented do not require latches and are therefore simpler to implement than existing approaches, and can serialize data at a higher rate with less power consumption than existing techniques, i.e., assuming the same technology and circuit speed.

Although specific embodiments of the present invention have been illustrated in the accompanying drawings and described in the foregoing detailed description, it will be understood that the invention is not limited to the particular embodiments described herein, but is capable of numerous rearrangements, modifications, and substitutions without departing from the scope of the invention. The following claims are intended to encompass all such modifications.

What is claimed is:

1. A clock frequency multiplication and data serialization circuit for converting Q parallel data bits having an associated clock signal of first frequency and period into a serial data stream having a frequency which is a multiple of said first frequency, said circuit comprising:

clock phase generating means coupled to receive the clock signal associated with said Q parallel data bits, said generating means outputting in response thereto Q synchronous clocks each of different phase per clock signal period; and logic circuitry coupled to receive said Q synchronous clocks and the Q parallel data bits, said logic circuitry using each of said Q synchronous clocks to gate a respective one of said Q parallel data bits such that the Q parallel data bits are sequentially output therefrom as a serial data stream having a frequency which is a multiple of said first frequency.

2. The frequency multiplication and data serialization circuit of claim 1, wherein said logic circuitry includes:
  means for detecting each of said Q synchronous clocks and outputting a signal pulse in response thereto;
  a plurality of AND gates, each AND gate being coupled to receive at a first input one of said signal pulses and at a second input a respective one of the parallel data bits; and
  OR circuit means coupled to receive in parallel the output signals of said plurality of AND Gates and combine said AND gate output signals into the serial data stream.

3. The frequency multiplication and data serialization circuit of claim 2, wherein said clock detecting means includes a plurality of edge detectors, each edge detector being coupled to receive one of said Q synchronous clocks output from said clock phase generating means, each edge detector outputting a signal pulse in response to a received clock.

4. The frequency multiplication and data serialization circuit of claim 3, wherein said clock detecting means includes Q edge detectors, said edge detectors each outputting a signal pulse on the rising edge of a received clock, each detector including a delay and an A NOT B logic circuit having an A input and a B input, the A input to said A NOT B logic and an input to said delay each being coupled to receive one of the Q synchronous clocks, the output of said delay being coupled to the B input to said A NOT B logic, an output pulse from said A NOT B logic circuit comprising said edge detector signal pulse.

5. The frequency multiplication and data serialization circuit of claim 3, wherein said clock detecting means includes Q edge detectors, said edge detectors each outputting a signal pulse on the falling edge of a received clock, each detector including a delay and an A NOT B logic circuit having an A input and a B input, the B input to said A NOT B logic and an input to said delay being coupled to receive one of the Q synchronous clocks, the output of said delay being coupled to the A input of said A NOT B logic, an output pulse from said A NOT B logic comprising said edge detector signal pulse.

6. The frequency multiplication and data serialization circuit of claim 3, wherein said clock detecting means includes Q edge detectors, said edge detectors each outputting a signal pulse on the rising edge of a received clock, each detector including a delay, an invertor and an AND gate, one input to said AND gate and an input to said delay each being coupled to receive one of the Q synchronous clocks, the output of said delay being coupled to the input of said invertor, the invertor output being coupled to a second input to said AND gate, an output from said AND gate comprising said edge detector signal pulse.

7. The frequency multiplication and data serialization circuit of claim 3, wherein said clock detecting means includes Q edge detectors, said edge detectors each outputting a signal pulse on the falling edge of a received clock, each detector including a delay, an invertor and an AND gate, the input to said invertor and the input to said delay each being coupled to receive one of the Q synchronous clocks, the output of said invertor being coupled to a first input to said AND gate and the output of said delay being coupled to a second input to said AND gate, an output from said AND gate comprising said edge detector signal pulse.

8. The frequency multiplication and data serialization circuit of claim 2, wherein said clock phase generating means comprises a delay line having Q taps, each of said taps outputting one of said Q synchronous clocks of different phase.

9. The frequency multiplication and data serialization circuit of claim 8, wherein said detecting means comprises Q separate detecting means, an input to each of said Q detecting means being coupled to one of said delay line taps, and wherein said plurality of AND gates comprise Q AND gates, one input of each of said Q AND gates being coupled to an output of a respective one of said Q detecting means.

10. A clock frequency multiplication and data serialization circuit for converting Q parallel data bits having an associated clock signal of first frequency and period into a serial data stream having a frequency which is Q times the first frequency, said circuit comprising:
  a delay line coupled to receive the clock signal associated with said Q parallel data bits, said delay line having Q taps, said taps each outputting one of Q synchronous delay clocks each of different phase;
  Q clock detecting means, each clock detecting means being coupled to a respective delay line tap to receive the corresponding delay clock, said clock detecting means each outputting a signal pulse in response to a received delay clock;
  Q AND gates, each AND gate being coupled at a first input to an output of a clock detecting means for receiving the corresponding signal pulse and at a second input to a respective one of said Q parallel data bits; and
  OR circuit means having Q inputs, outputs of said AND gates being coupled in parallel to the Q inputs of said OR circuit means, said OR circuit means combining output signals from said AND Gates into a serial data stream having a frequency which is Q times said first frequency.

11. The clock frequency multiplication and data serialization circuit of claim 10, wherein said circuit produces return-to-zero data serialization and wherein said Q clock detecting means comprise Q edge detectors, said edge detectors each including a delay therein, each edge detector delay being less than a delay between adjacent delay clocks of the delay line.

12. The clock frequency multiplication and data serialization circuit of claim 10, wherein said circuit produces nonreturn-to-zero data serialization, and wherein said Q clock detecting means each comprises an A NOT B logic circuit having an A input and a B input, the A input of said A NOT B logic being coupled to receive a f(m-1)delayed clock of the delay line and the B input to said A NOT B logic being coupled to receive a f(m) delayed clock of the delay line, wherein M=1, 2, 2, . . . , Q-1.

13. The clock frequency multiplication and data serialization circuit of claim 10, wherein said circuit produces a combination return to zero and nonreturn to zero data serialization, and wherein at least one of said Q clock detecting means comprises an edge detector, said edge detector including a delay therein less than a delay between adjacent delay clocks of the delay line, and wherein said Q clock detecting means includes at least an A NOT B logic circuit having an A input and a B input, the A input of said A NOT B logic being coupled to receive a first delayed clock of the delay line and the B input to said A NOT B logic being coupled to receive a second delayed clock of the delay line, said second delayed clock comprising the next subsequent delayed clock from said first delay clock.

14. A frequency multiplication and synchronization circuit for generating a synchronous high frequency signal from a low frequency signal, said circuit comprising:
   clock phase generating means coupled to receive the low frequency signal and output in response thereto Q synchronous clocks each of different phase;
   Q clock detectors coupled to receive one of said Q synchronous clocks and output a signal pulse in response thereto; and
   logic circuit means coupled to receive in parallel the output signal pulses of said Q clock detectors, and output therefrom said synchronous high frequency signal.

15. The frequency multiplication and synchronization circuit of claim 14, wherein said clock phase generating means comprises a delay line having Q taps, each tap outputting one of said Q synchronous clocks of different phase.

16. The frequency multiplication and synchronization circuit of claim 15, wherein said Q clock detecting means comprise Q edge detectors, each edge detector outputting a signal pulse on one of the rising and falling edges of the received clock.

17. The frequency multiplication and synchronization circuit of claim 16, wherein said logic circuit means comprises an OR logic circuit.

18. The frequency multiplication and synchronization circuit of claim 16 wherein said logic circuit means comprises a multiplexer.

19. The frequency multiplication and synchronization circuit of claim 14, wherein said logic circuit means further functions to simultaneously convert Q parallel data bits into a serial data stream comprising said synchronous high frequency signal.

20. The frequency multiplication and synchronization circuit of claim 19, wherein said logic circuit means comprises:
   Q AND gates, each AND gate being coupled at a first input to an output of a clock detector for receiving the corresponding signal pulse and at a second input to a respective one of said Q parallel data bits; and
   OR circuit means having Q inputs, outputs of said AND gates being coupled in parallel to the Q inputs of said OR circuit means, said OR circuit means combining output signals from said AND gates to form said serial data stream.

21. A clock frequency multiplication and data serialization circuit for converting Q parallel data bits having an associated clock signal of first frequency and period into a serial data stream having a frequency which is a multiple of said first frequency, said circuit comprising:
   clock phase generating means coupled to receive the clock signal associated with said Q parallel data bits, said generating means outputting in response thereto Q synchronous clocks each of different phase per clock signal period; and
   logic circuitry means coupled to receive said Q synchronous clocks and the Q parallel data bits, said logic circuitry means functioning to simultaneously frequency multiply and data serialize the Q parallel data bits to provide a serial data stream having a frequency which is a multiple of said first frequency.

* * * * *

UNITED STATES PATENT AND TRADEMARK OFFICE
CERTIFICATE OF CORRECTION

PATENT NO. : 5,107,264
DATED : April 21, 1992
INVENTOR(S) : Ilya I. Novof

It is certified that error appears in the above-identified patent and that said Letters Patent is hereby corrected as shown below:

Col. 2, line 47, "a logic circuiting" should read --logic circuitry--.

In the Claims:

Col. 8, line 54, "M=1, 2, 2,..." should read --m=1, 2, 3,...--.

Signed and Sealed this

Thirteenth Day of July, 1993

Attest:

MICHAEL K. KIRK

Attesting Officer

Acting Commissioner of Patents and Trademarks